United States Patent [19]
Tsujimoto et al.

[11] Patent Number: 6,149,758
[45] Date of Patent: Nov. 21, 2000

[54] SHEET REMOVING APPARATUS AND METHOD

[75] Inventors: Masaki Tsujimoto, Urawa; Hiroshi Saito, Okegawa; Koji Okamoto, Ageo; Kenji Kobayashi, Omiya; Tsuyoshi Kurita, Shiraoka-machi, all of Japan

[73] Assignee: Lintec Corporation, Japan

[21] Appl. No.: 09/090,762

[22] Filed: Jun. 4, 1998

[30] Foreign Application Priority Data

Jun. 20, 1997 [JP] Japan ................................. 9-180669
Nov. 28, 1997 [JP] Japan ................................. 9-341895

[51] Int. Cl.$^7$ .................................................... B32B 35/00
[52] U.S. Cl. ........................... 156/344; 156/584; 156/247
[58] Field of Search .................................... 156/230, 234, 156/241, 275.5, 275.7, 247, 344, 584

[56] References Cited

U.S. PATENT DOCUMENTS

| | | | |
|---|---|---|---|
| 4,285,759 | 8/1981 | Allen et al. ........................ | 156/344 X |
| 5,006,190 | 4/1991 | Earle . | |
| 5,009,735 | 4/1991 | Ametani et al. ..................... | 156/344 X |
| 5,254,201 | 10/1993 | Konda et al. ........................... | 156/344 |
| 5,492,590 | 2/1996 | Sakai ...................................... | 156/344 |
| 5,891,298 | 4/1999 | Kuroda et al. . | |

FOREIGN PATENT DOCUMENTS

| 0 318 806 | 6/1989 | European Pat. Off. ........ H01L 21/00 |
|---|---|---|
| 1-272129 | 10/1989 | Japan . |
| WO97/08745 | 3/1997 | WIPO . |

*Primary Examiner*—Mark A. Osele
*Attorney, Agent, or Firm*—Marger Johnson & McCollom, P.C.

[57] ABSTRACT

In an apparatus and method of using an adhesive tape to remove a protecting sheet applied to a semiconductor wafer, a heat-sensitive adhesive tape is thermocompressively bonded by a heat tool to an edge portion of the protecting sheet, after which a cutting blade cuts the adhesive sheet to a prescribed length, and then a tape peeling head grasps the cut adhesive tape and moves in a direction to pull the adhesive tape so as to remove the protecting sheet of the semiconductor wafer, with the removed sheet then being disposed of together with the adhesive tape into a disposal box.

14 Claims, 16 Drawing Sheets

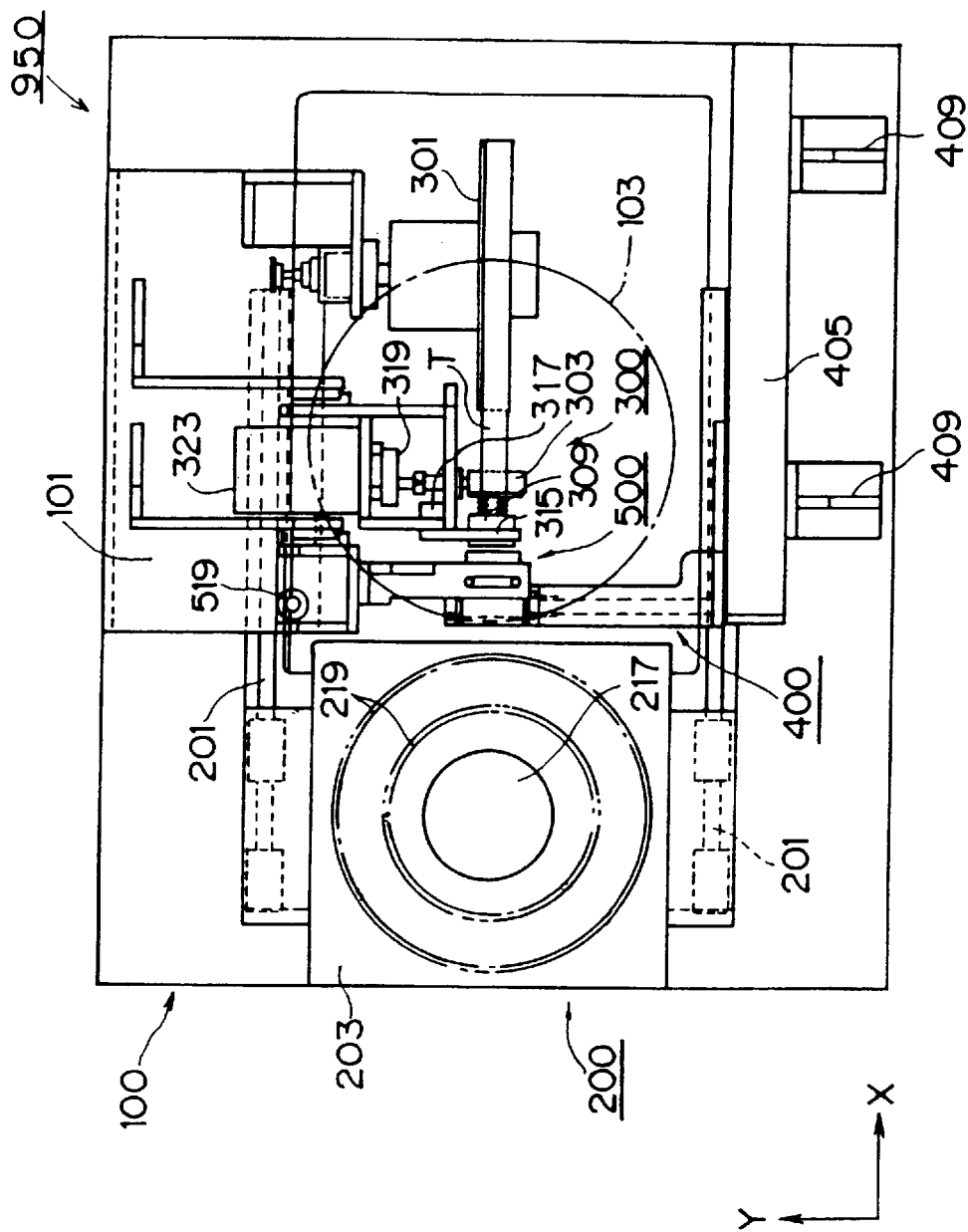

SHEET REMOVING APPARATUS AND METHOD

BACKGROUND OF THE INVENTION

1. Field of the Invention

The present invention relates to a sheet removing apparatus and method, and in particular relates to a sheet removing apparatus and method for removing sheets applied to plate-shaped members such as semiconductor wafers and the like.

2. Description of the Prior Art

When a semiconductor is manufactured, a grinding process is carried out on the underside surface of a semiconductor wafer (hereafter referred to simply as "wafer") in order to create a thin, miniaturized semiconductor chip, but before such grinding process is carried out, a protecting sheet made from an adhesive film or the like is bonded to the upper surface (i.e., the surface formed with the circuit) of the wafer. Then, after grinding is completed, the protecting sheet is removed.

In one prior art method of removing the protecting sheet, a press roller is used to apply a pressure sensitive adhesive tape having a width of 25 mm~50 mm to the protecting sheet bonded to the top of the wafer, and then this pressure sensitive adhesive tape is pulled to remove the protecting sheet from the wafer.

However, because this method involves the use of a press roller to press the pressure sensitive adhesive tape against the protecting sheet in order to bond the pressure sensitive adhesive tape to the protecting sheet, there is a risk of wafer damage due to such pressing force. In particular, in view of the recent trends for larger diameter and thinner wafers, it has become necessary to take such wafer damage risk into consideration.

SUMMARY OF THE INVENTION

In view of the problems of the prior art stated above, it is an object of the present invention to provide an apparatus and method for removing a sheet such as a protecting sheet or the like from a plate-shaped member such as a semiconductor wafer or the like without damaging the plate-shaped member.

In order to achieve the object stated above, the present invention provides an apparatus and method of using an adhesive tape to remove a sheet applied to a plate-shaped member, in which the adhesive tape is bonded to an edge portion of the sheet, after which the adhesive tape is pulled to peel the sheet away from the plate-shaped member. In the preferred embodiment, the adhesive tape is a heat-sensitive adhesive tape. In the case where a reference portion is formed in the plate-shaped member (e.g., an orientation flat portion or V-notch formed in a semiconductor wafer), the position of such reference portion is detected, and then the adhesive tape is bonded to an edge portion of the sheet located at a position away from the position of the reference portion.

Further, if the sheet applied to the plate-shaped member is a UV hardening type adhesive sheet comprising a base film and a UV hardening type adhesive layer (i.e., an adhesive force of the adhesive layer is weakened by ultraviolet light, which in recent years has been used in the production of larger diameter and thinner wafers to ease the removal of such sheets), the apparatus and method of the present invention includes irradiating the sheet with ultraviolet light prior to using the adhesive tape to peel the sheet off the plate-shaped member.

It should be noted that even though the present invention is particularly suited to removing a protecting sheet applied to a wafer, the present invention is not limited to such case, and instead the present invention provides a general apparatus and method for using an adhesive tape to remove a sheet applied to a plate-shaped member.

BRIEF DESCRIPTION OF THE DRAWINGS

FIG. 8 is a plan view of the sheet removing portion according to the present invention.

DETAILED DESCRIPTION OF THE PREFERRED EMBODIMENTS

Next, an example apparatus for removing a wafer protecting sheet according to the present invention will be given below.

Figure 1:
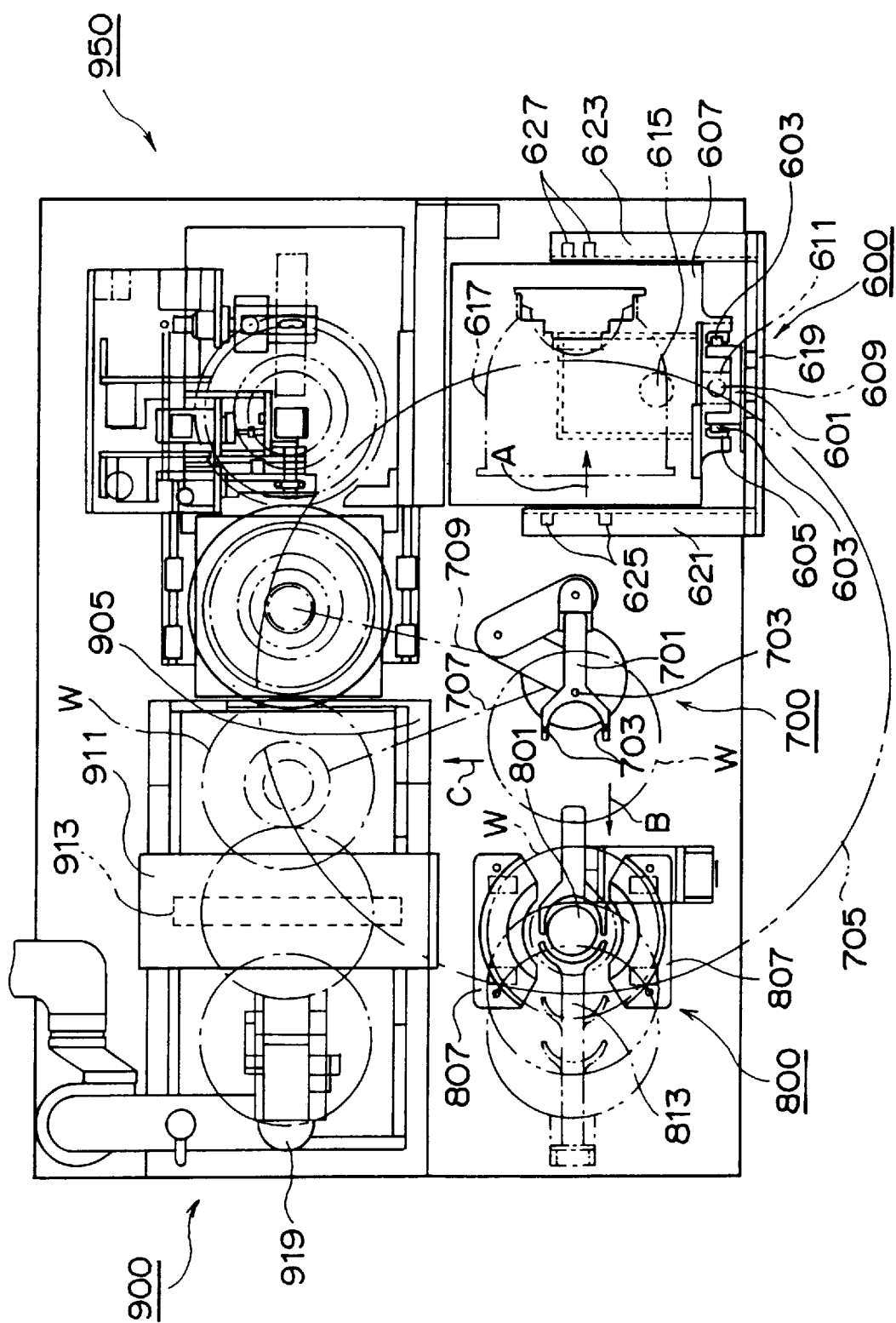
FIG. 1 is a plan view of an embodiment of a protecting sheet removing apparatus according to the present invention.

In this connection, FIG. 1 shows a plan view of an embodiment of a protecting sheet removing apparatus according to the present invention. As shown in this drawing, the protecting sheet removing apparatus is constructed from a wafer supply portion 600, a wafer conveyor portion 700, an orientation flat alignment portion 800, a UV irradiation portion 900, and a sheet removing portion 950. Next, a description of each portion will be given below.

Figure 2:
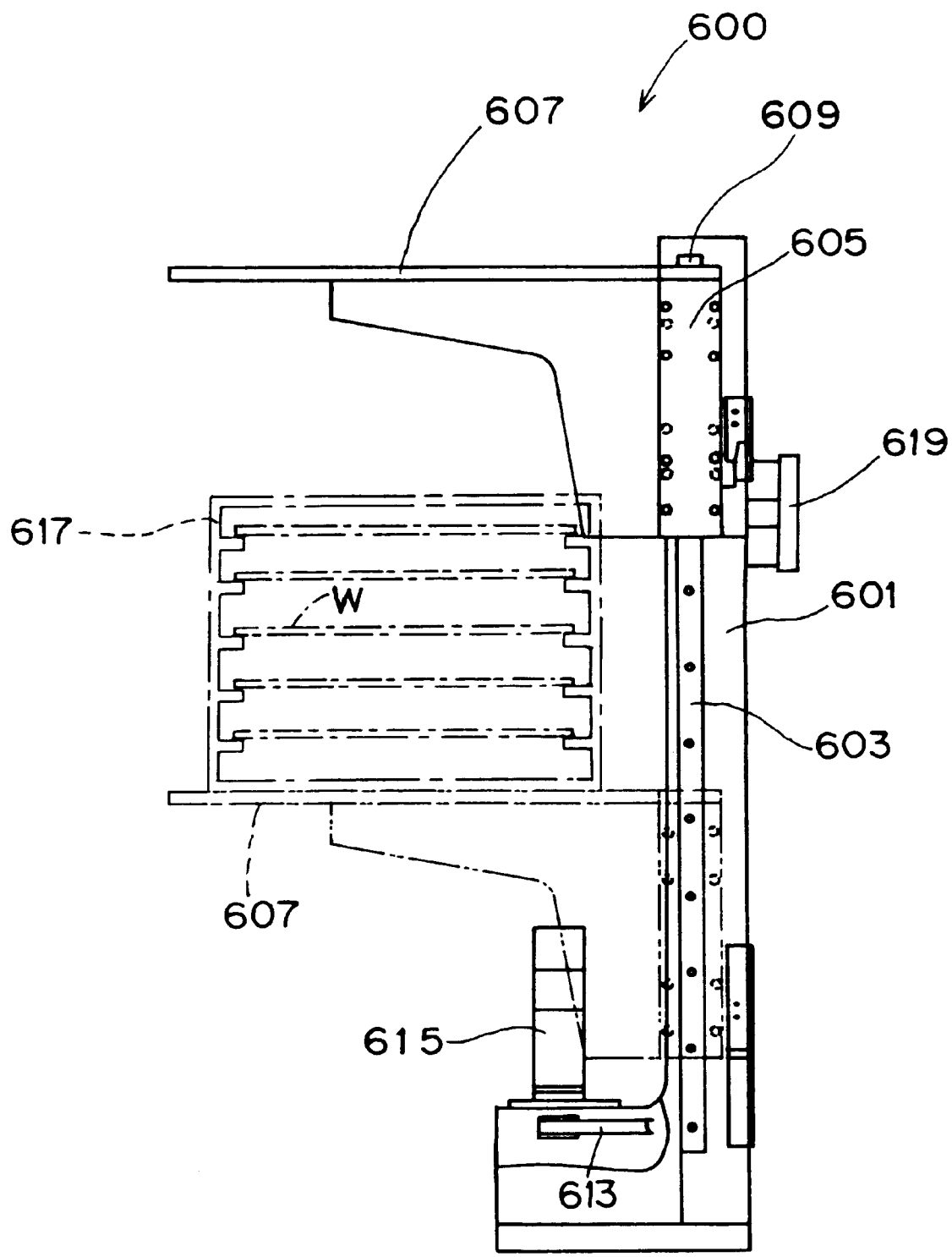
FIG. 2 is an illustration of a wafer supplying portion taken along arrow A in FIG. 1.

FIG. 2 is a view of the wafer supply portion 600 taken along the arrow A in FIG. 1, and as shown in this drawing, the wafer supply portion 600 includes two guide rails 603 mounted to a support 601 and a table 607 which is mounted to the guide rails 603 via guides 605 so as to be freely movable in the vertical direction. A ball screw 609 is provided along the support 601, and a plate 611 which engages the ball screw 609 is connected to the table 607. The ball screw 609 is rotated by a motor 615 via a belt 613, and this rotation moves the table 607 in the vertical direction. A wafer carrier (wafer conveying container) 617 is arranged on the table 607, and housed in a rack of the wafer carrier 617 are a plurality of wafers W which have protecting sheets bonded thereto.

The support 601 is further provided with a plate 619, and connected to the plate 619 are plates 621, 623 (FIG. 1) on which wafer sensors (light transmission type, light reflecting type, etc.) 625, 627 are provided. In this way, while the wafer carrier 617 is being moved vertically, data such as the step position and number of wafers W are detected by the sensors 625, 627.

The conveyor portion 700 is equipped with a multiaxis movable arm 701 which includes a tip portion provided with a suction member 703 which is adapted to hold a wafer W by suction so as to enable the wafer W to be carried on top of the movable arm 701. In this connection the movable arm 701 is capable of conveying a wafer W within the range shown by the chain-line circle 705 of FIG. 1.

Figure 3:
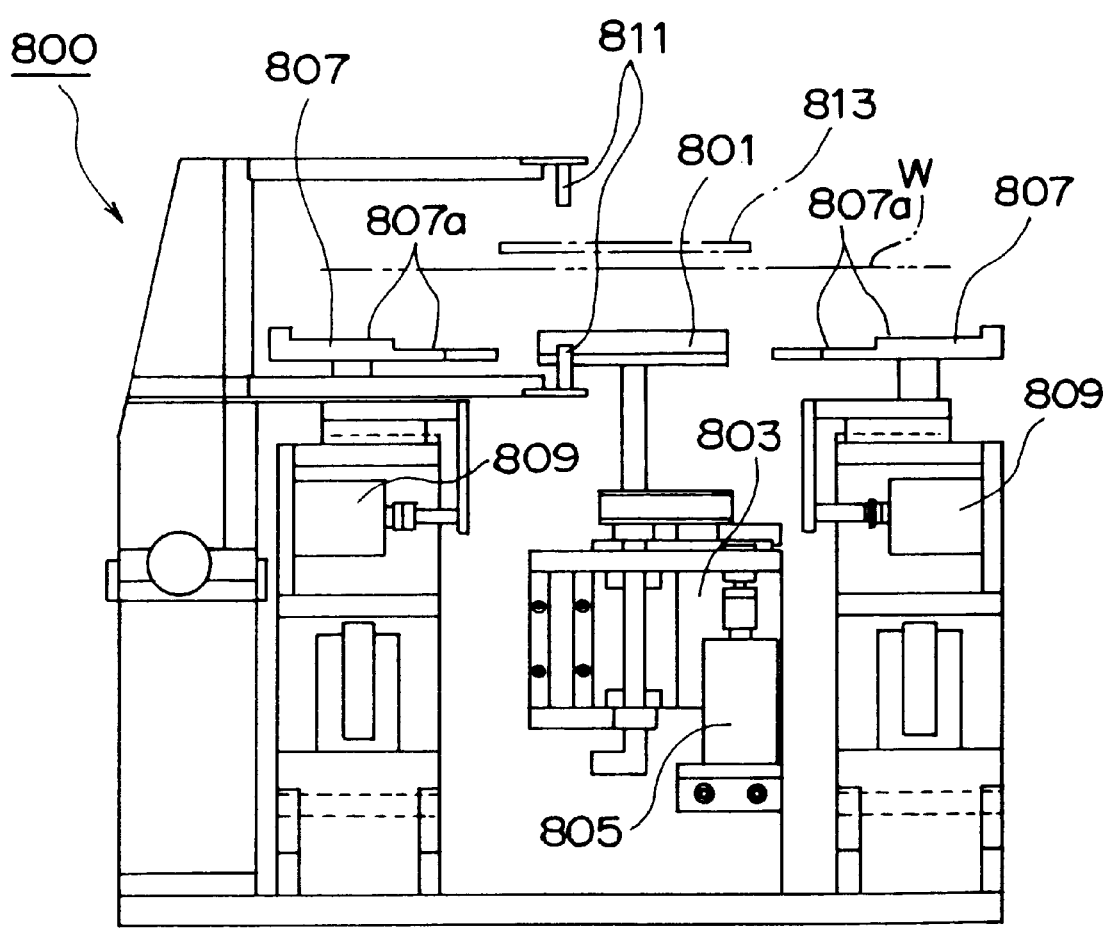
FIG. 3 is an illustration of an orientation flat alignment portion taken along arrow B in FIG. 1.
Figure 4:
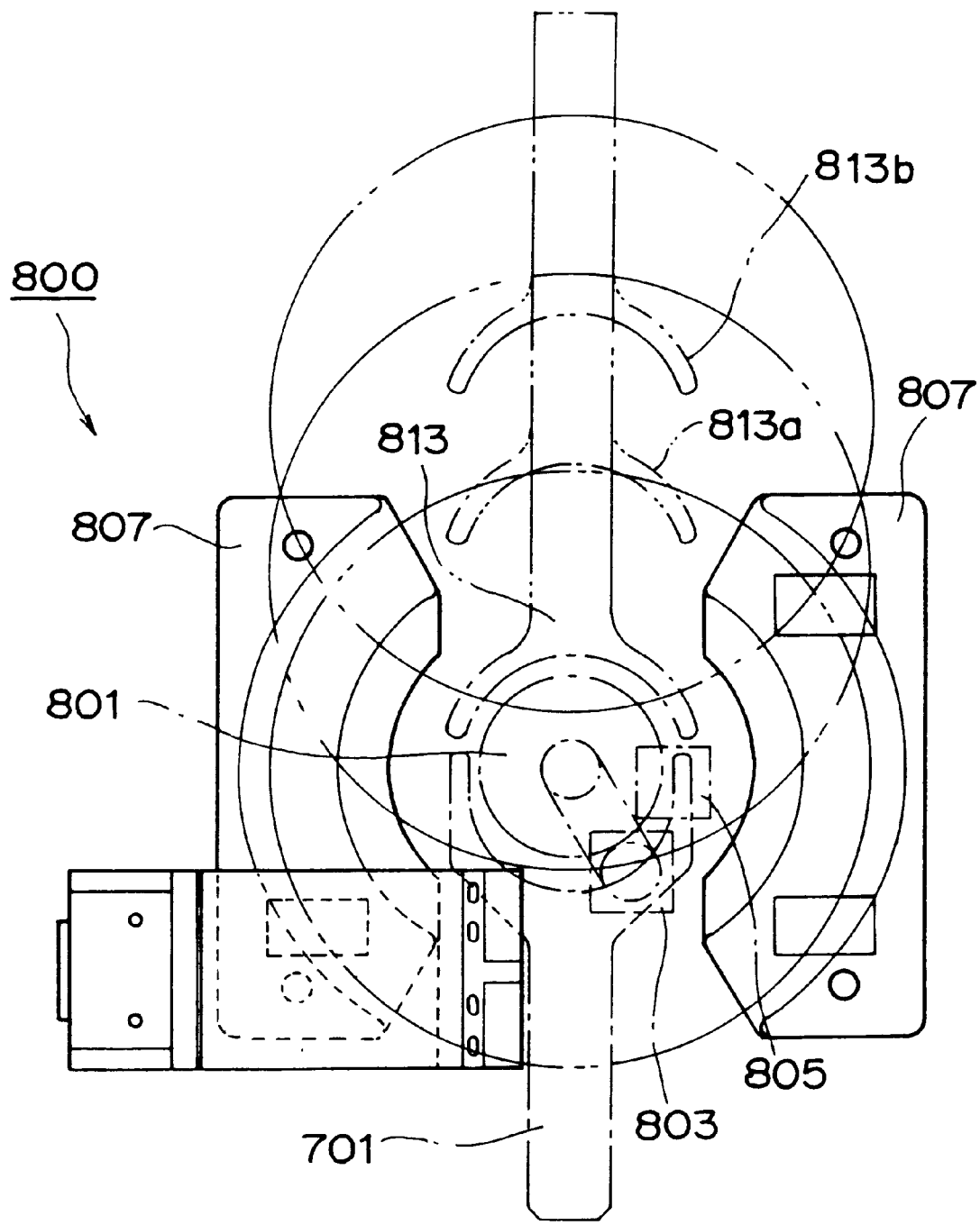
FIG. 4 is a plan view of the orientation flat alignment portion.

Next, FIG. 3 shows the orientation flat alignment portion 800 as seen along the arrow B of FIG. 1, and FIG. 4 is a plan view thereof. The orientation flat alignment portion 800 carries out positioning by detecting the orientation flat portion formed as a reference portion in the wafer W, and then rotating the wafer W so that the orientation flat portion is positioned away from the bonding portion of adhesive tape.

In accordance with this structure, the movable arm 701 is used to place a wafer W on the turntable 801 which is equipped with a suction port to enable the wafer W to be held in place by suction. The turntable 801 is rotated by a motor 803 and moved vertically by a cylinder 805. Provided on either side of the turntable 801 are centering plates 807 which are movable in the direction of the turntable 801 by means of cylinders 809. The centering plates 807 are formed with stepped portions 807a corresponding to the size of the diameter of the wafers W.

In this way, after a wafer W has been conveyed by the movable arm 701 and placed on the turntable 801, the centering plates 807 are moved toward the turntable 801 to center the wafer W. Then, with the wafer W being held by suction, the turntable 801 is rotated. In this state, light transmission type or light reflecting type sensors 811 are arranged above and below the wafer W to detect the orientation flat portion of the wafer W, and upon detecting such orientation flat portion, the turntable 801 is rotated only by a prescribed angular amount and then stopped. In this way, the wafer W is positioned so that the orientation flat portion is not placed at the position of the bonding portion of the adhesive tape. Namely, when the adhesive tape is being bonded to the protecting sheet by a heating/cutting portion 500 (FIG. 13) described below, the orientation flat portion is kept away from the bonding portion of the adhesive tape, and this makes it possible to reliably bond the adhesive tape to the protecting sheet.

When the wafer W is undergoing positioning, a wafer holding arm 813 which holds the next wafer by suction is arranged above the turntable 801 on standby at a position corresponding to the size of the wafer W (as shown by the chain-line curves 813a, 813b in FIG. 4).

Figure 5:
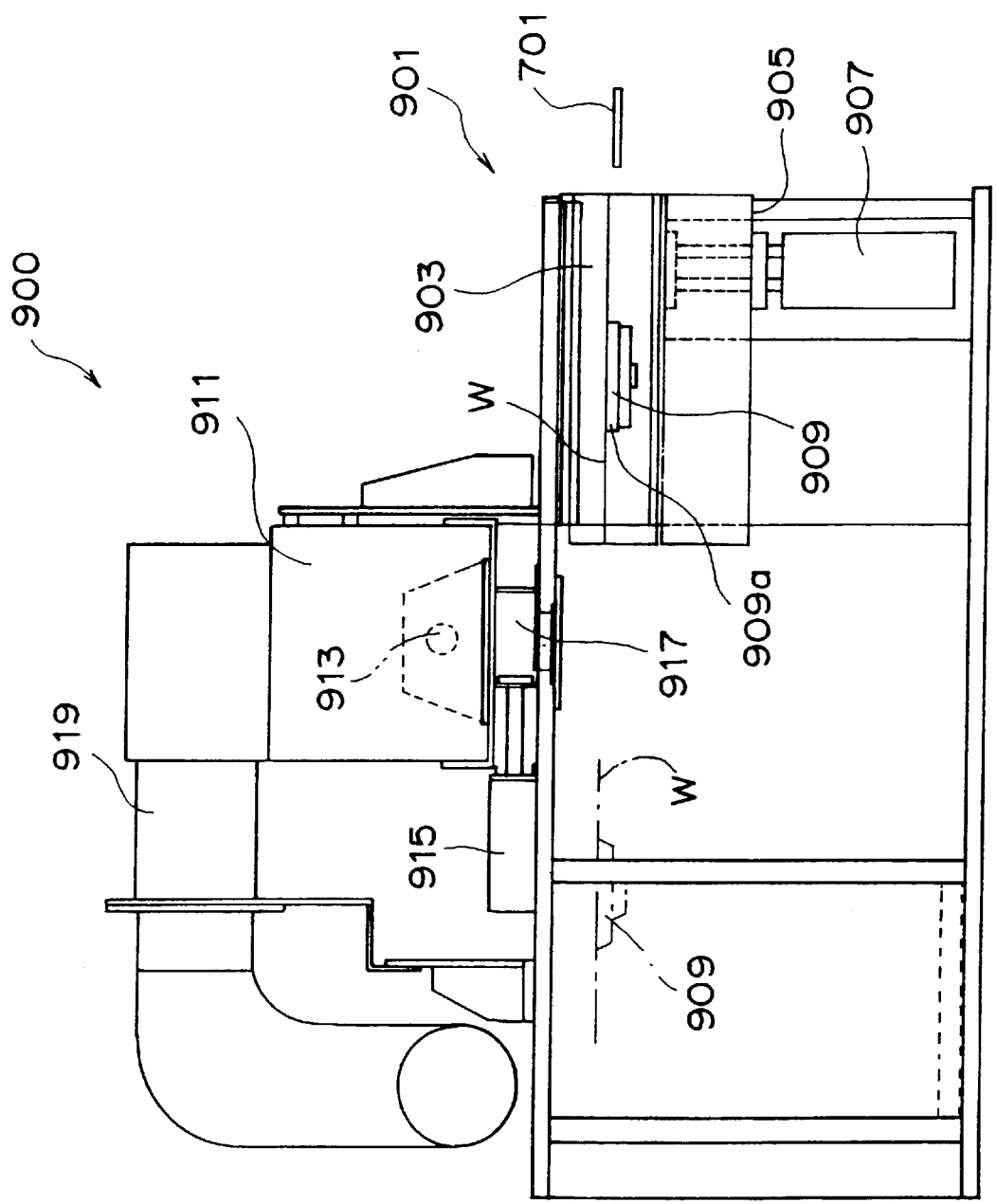
FIG. 5 is an illustration of a UV irradiation portion taken along arrow C in FIG. 1.

Next, FIG. 5 is a view of the UV irradiation portion 900 taken along the arrow C in FIG. 1, and as shown in this drawing, an L-shaped aperture portion 903 is formed in an angular portion 901, and from this aperture portion 903 the wafer W is conveyed by the movable arm 701 along the line 707 shown in FIG. 1. The aperture portion 903 can be opened and closed by means of an L-shaped cover 905 driven by a cylinder 907. In this state, the wafer W is held on a table 909 by suction. Further, the UV irradiation portion 900 includes a UV lamp chamber 911 provided with a UV lamp 913 at the center thereof. Arranged below the UV lamp 913 is a shutter 917 which is opened and closed by a cylinder 915. Although not shown in the drawings, exhaust air in the UV lamp chamber 911 is forced out via a duct 919 by an exhaust expelling force.

When the wafer W is placed on the table 909, the wafer W is held to the table 909 by suction created by a suction means 909a. Then, the cover 905 is closed, the shutter 917 is opened, and the table 909 which holds the wafer W (by suction) is moved in the leftward direction shown in FIG. 5 to irradiate the adhesive surface of the protecting sheet of the wafer W with ultraviolet light. After irradiation is completed, the table 909 is once again returned toward the angular portion 901, the suction means 909a is operated to remove the suction on the wafer W, and the wafer W is conveyed out of the UV irradiation portion 900 by the movable arm 701. After being conveyed out of the UV irradiation portion 900, the wafer W is then conveyed to the sheet removing portion 950 along the line 709 shown in FIG. 1. A detailed description of the sheet removing portion 950 will be given below.

In this connection, when the protecting sheet used for the wafer W is not a UV hardening type adhesive protecting sheet, the UV irradiation portion 900 may be omitted.

Next, the overall operations of the protecting sheet removing apparatus will be described. The sequence of such operations is as follows:

(1) The wafer carrier 617 is placed on the table 607 of the wafer supply portion 600 either manually or automatically by an automatic conveying device.

(2) The table 607 is moved vertically by the driving force of the motor 615, and as this is being done the sensors 625, 627 detect data such as the step position and number of the wafers W inside the wafer carrier 617.

(3) Starting from the top step of the wafer carrier 617, the wafers W are picked up one at a time by the movable arm 701 and conveyed to the orientation flat alignment portion 800. In this regard, the table 607 is raised to raise the wafer carrier 617 one step at a time to enable the movable arm 701 to pick up each successive wafer W.

(4) In the orientation flat alignment portion 800, the wafer W is centered by the centering plates 807, and then, with the wafer W held by suction to the turntable 801, the turntable 801 is rotated. During this time, the movable arm 701 picks up the next wafer W from the wafer carrier 617 and conveys it to the wafer holding arm 813 which is held on standby.

(5) While being held by suction, the wafer W is rotated by the turntable 801 as the sensor 811 searches for the orientation flat portion of the wafer W. After the sensor 811 detects the orientation flat portion of the wafer W, the wafer W is further rotated only through a prescribed angle and is then stopped at such position, with the holding suction on the wafer W being maintained.

(6) After positioning the wafer W, the wafer W is then moved by the movable arm 701 to the UV irradiation portion 900.

(7) After being irradiated with UV light, the wafer W is conveyed to the sheet removing portion 950 by the movable arm 701, and in the sheet removing portion 950 the protecting sheet of the wafer W is removed.

(8) After the protecting sheet has been removed, the wafer W is conveyed out of the sheet removing portion 950 by the movable arm 701, and placed in the wafer carrier 617 at a prescribed step.

(9) The same steps as above are then carried out for the next wafer W, and when all the wafers W in the wafer carrier 617 have undergone sheet removal, the wafer carrier 617 is conveyed to the next process either manually or automatically by an automatic conveying device. In this connection, if the protecting sheet used for the wafers W is not a UV hardening type adhesive protecting sheet, the steps of transporting the wafer W to the UV irradiation portion and irradiating the wafer W with UV light may be omitted from the above process.

In accordance with the above apparatus and method, it becomes possible to remove a sheet such as a protecting sheet or the like from a plate-shaped member such as a wafer or the like without damaging such plate-shaped member, and because the reference portion of the wafer (orientation flat portion, V-notch, etc.) is positioned away from the bonding portion of the adhesive tape, it is possible to reliably bond the adhesive tape to the protecting sheet, and this makes it possible reliably remove the protecting sheet.

It should be noted that the present invention is not limited to the use of a movable arm as a means of conveying the wafers W, and instead it is possible to use other wafer conveying means. Furthermore, the arrangement of each portion is not limited to the embodiment described above. Further, in the case where a UV hardening type adhesive protecting sheet is used, by arranging the wafer supply portion, orientation flat portion and UV irradiation portion in that order, and by carrying out positioning of the wafer during the relatively time-consuming step of UV irradiation, more efficient use of time can be achieved, and this makes it possible to process more wafers in a fixed amount of time.

Next, the sheet removing portion 950 will be described in detail.

Figure 6:
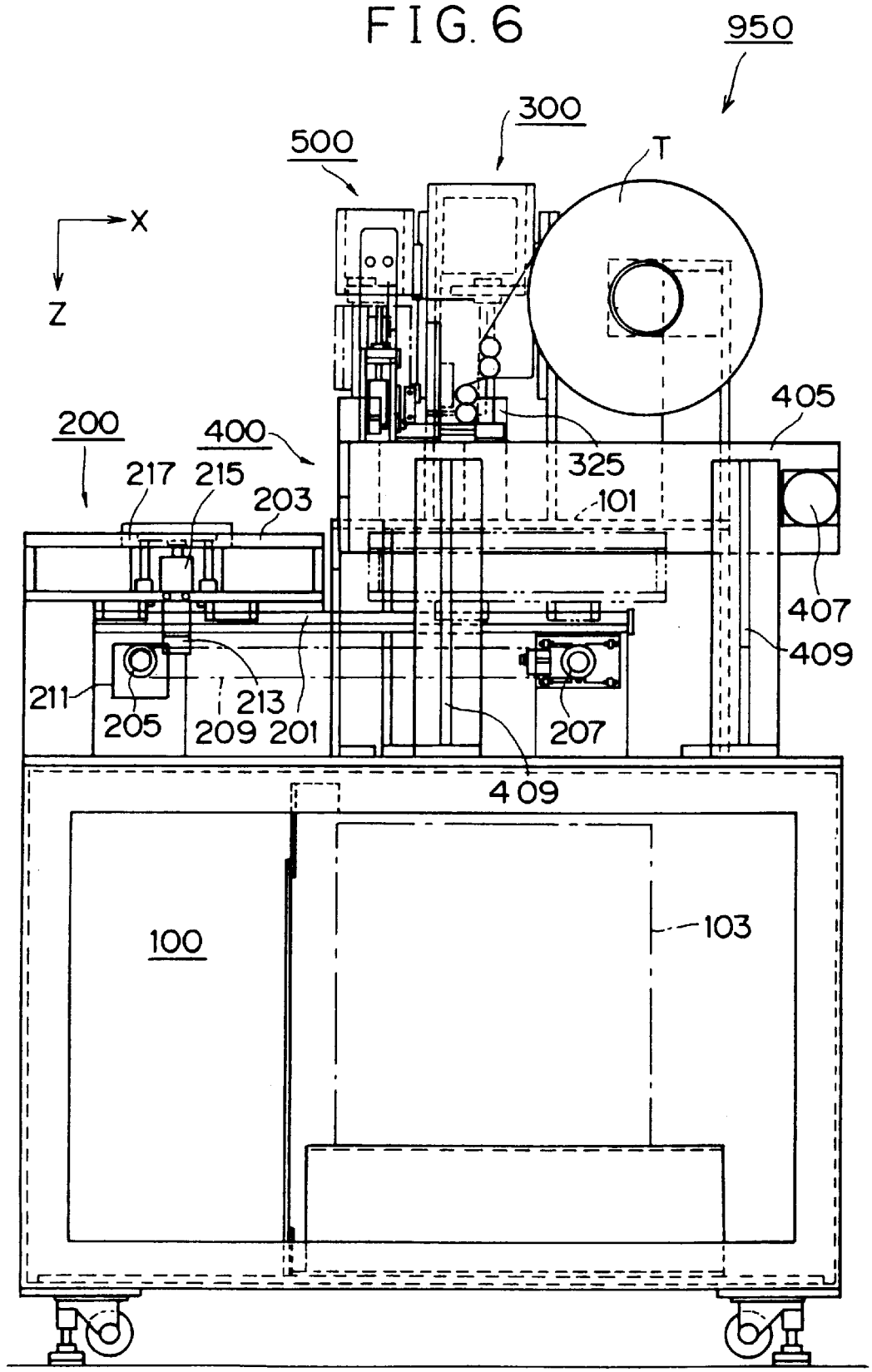
FIG. 6 is a front view of a sheet removing portion according to the present invention.
Figure 7:
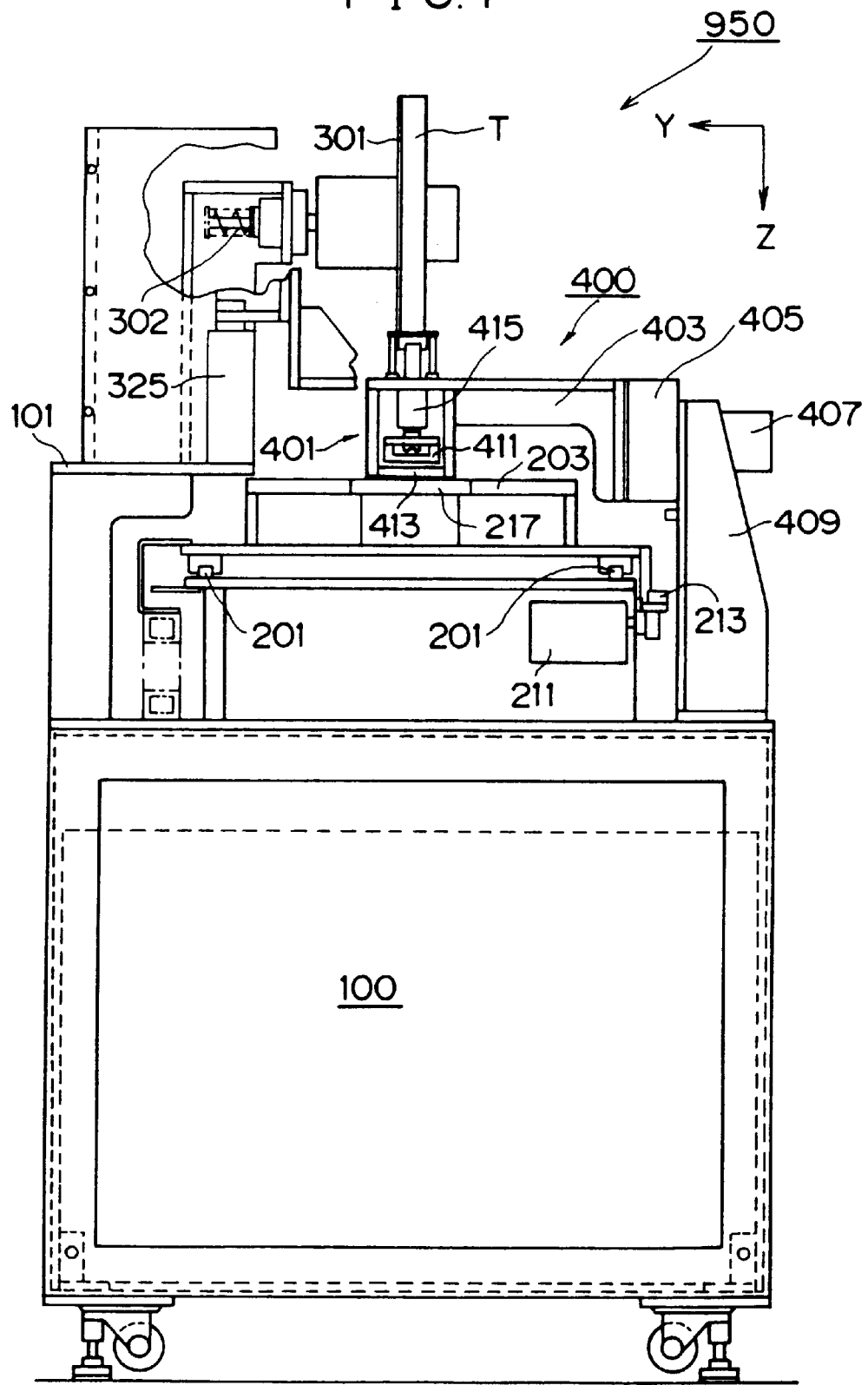
FIG. 7 is a side view of the sheet removing portion according to the present invention.

In this connection, FIG. 6 is a front view of the sheet removing portion 950, and FIGS. 7 and 8 are respectively side and plan views thereof. As shown in these drawings, the sheet removing portion 950 is constructed from a platform 100, a table portion 200, a tape supplying portion 300, a peeling head portion 400, and a heating/cutting portion 500.

First, in describing the general structure of the sheet removing portion 950, a wafer W which has a protecting sheet bonded thereto is conveyed by the table 200. Meanwhile, the adhesive tape T, which is supplied from the tape supplying portion 300, is drawn out by the peeling head portion 400. Next, the heating/cutting portion 500 bonds the adhesive tape T by means of thermocompression to an end portion of the protecting sheet, and then cuts the adhesive tape T to a prescribed length. Then, the peeling head portion 400 grasps and pulls the adhesive tape to remove the protecting sheet off the wafer W. In this connection, a detailed description of each portion is given below.

The table portion 200 is equipped with two guide rails 201 provided above the platform 100 and a table 203 which is provided on the guide rails 201 so as to be movable in the X direction shown in the drawings. Further, a belt 209 is suspended between pulleys 205, 207 above the platform 100, with the pulley 205 being rotated by a motor 211. The belt 209 is connected to the table 203 by a coupling 213, and in this way the table 203 can be moved along the guide rails 201 by the rotation of the motor 211.

Arranged in the center of the table 203 is an ascension/descension table 217 which is raised and lowered by a cylinder 215. Further, a plurality of annular suction grooves 219 which are concentric with the ascension/descension table 217 and which have diameters that correspond to wafer diameters are formed in the table 203, and formed in each of these suction grooves 219 are a plurality of suction holes. With this structure, the wafer W can be held in place by suction created by applying negative pressure to the suction holes of the suction grooves 219. On the other hand, when the wafer W is to be picked up from the table 203, the suction is removed and then the cylinder 215 is driven to raise the ascension/descension table 217.

In this embodiment, the adhesive tape T comprises a heat-sensitive adhesive tape made by providing a heat-resistant film such as polyethylene terephthalate with a heat-sensitive adhesive, but it is also possible to use a heat-sensitive adhesive tape made by providing a base material with a heat-sensitive adhesive property. The adhesive tape T is set on the reel 301 and supplied to the tape supplying portion 300. Further, a spring 302 (FIG. 7) is provided on the rotation shaft of the reel 301 to apply a frictional force via a friction plate to the rotation shaft of the reel 301.

Figure 10:
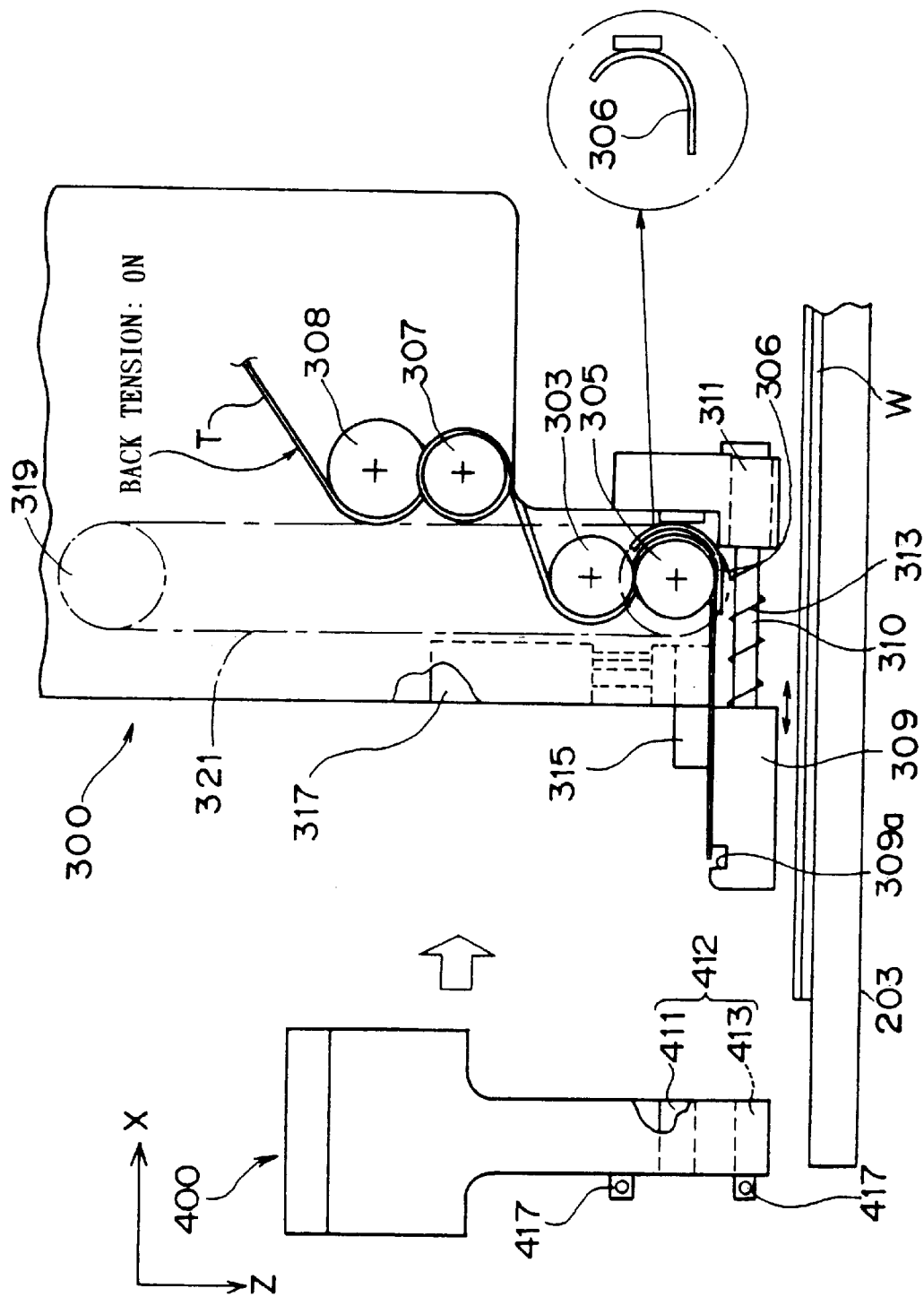
FIGS. 10, 11, 12, 13, 14, 15, and 16 are explanatory drawings showing the operations of the sheet removing portion according to the present invention.

As shown in FIG. 10, the tape supplying portion 300 is equipped with a pinch roller 303 and a tension roller 305 which are in mutual compressive contact with each other, a guide roller 307, and a pinch roller 308. The lower end portion of the tape supplying portion 300 is equipped with a tape receiving plate 309 provided on a ball bush 311 via a shaft 310. The tape receiving plate 309, which is movable in the X-axis direction, is normally biased in a protruding direction (i.e., towards the left in FIG. 10) by a spring 313.

After being supplied out of the reel 301 and passed between the pinch roller 308 and the guide roller 307, the direction of the adhesive tape T is switched, and then after being further passed between the pinch roller 303 and the tension roller 305, the adhesive tape T is sent to the tape receiving plate 309, where it is pressed against the top of the tape receiving plate 309 by a tape pressing plate 315. A cutter groove 309a is formed in the front end portion of the tape receiving plate 309, and the tape pressing plate 315 is driven by a cylinder 317. Further, a timing belt 321 is suspended at the tension roller 305 from a timing pulley 319, and the timing pulley 319 is driven by a motor 323 (FIG. 8). The tension roller 305 rotates in a direction opposite the feeding direction of the adhesive tape T in order to apply a tensile force (back tension) on the adhesive tape T in the direction opposite the feeding direction.

The rear portion of the tension roller 305 (the right side in FIG. 10) is provided with a tape pressing guide 306 to prevent retrogression of the adhesive tape T on top of the tape receiving plate 309.

The tape supplying portion 300 is movable in the vertical direction (the Z-axis direction in the drawings). Namely, as shown in FIG. 7, the tape feeding portion 300 is moved in the Z-axis direction by a cylinder 325 which is fixed to a base plate 101 provided on the platform portion 100.

As is further shown in FIG. 7, the peeling head portion 400 is equipped with a peeling head 401 and an arm 403 for supporting the peeling head 401, with the arm 403 being provided on a guide 405 so as to be freely movable in the X-axis direction. The arm 403 is driven by a motor 407 provided at an end portion of the guide 405 via a power transmission mechanism (not shown in the drawings). The guide 405 is mounted above the platform 100 by means of a support plate 409.

The peeling head 401 is equipped with a tape chuck 412 comprised of an upper jaw 411 and a lower jaw 413, with the upper jaw 411 being moved by a cylinder 415 to open and close the tape chuck 412. The peeling head 401 is also provided with a detection sensor 417 (such as a photoelectric sensor or the like; see FIG. 10) to detect whether or not the adhesive tape T is present inside the tape chuck 412.

Figure 9A:
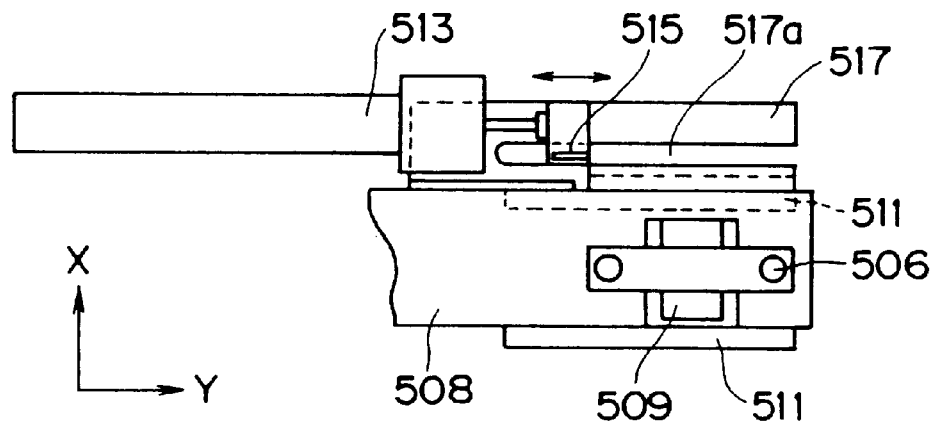
FIGS. 9A and 9B are respectively plan and side views of a heating/cutting portion according to the present invention.
Figure 9B:
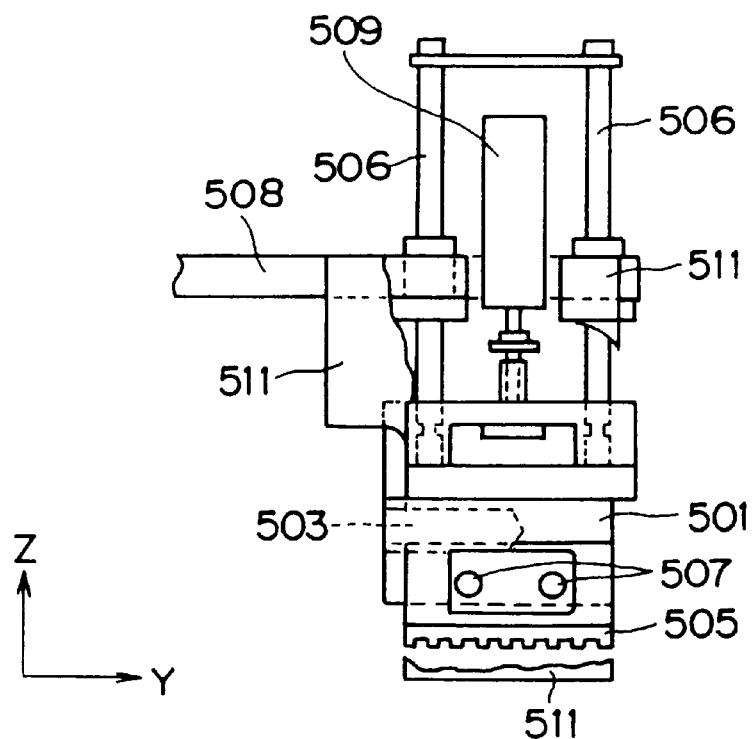
Figure 13:
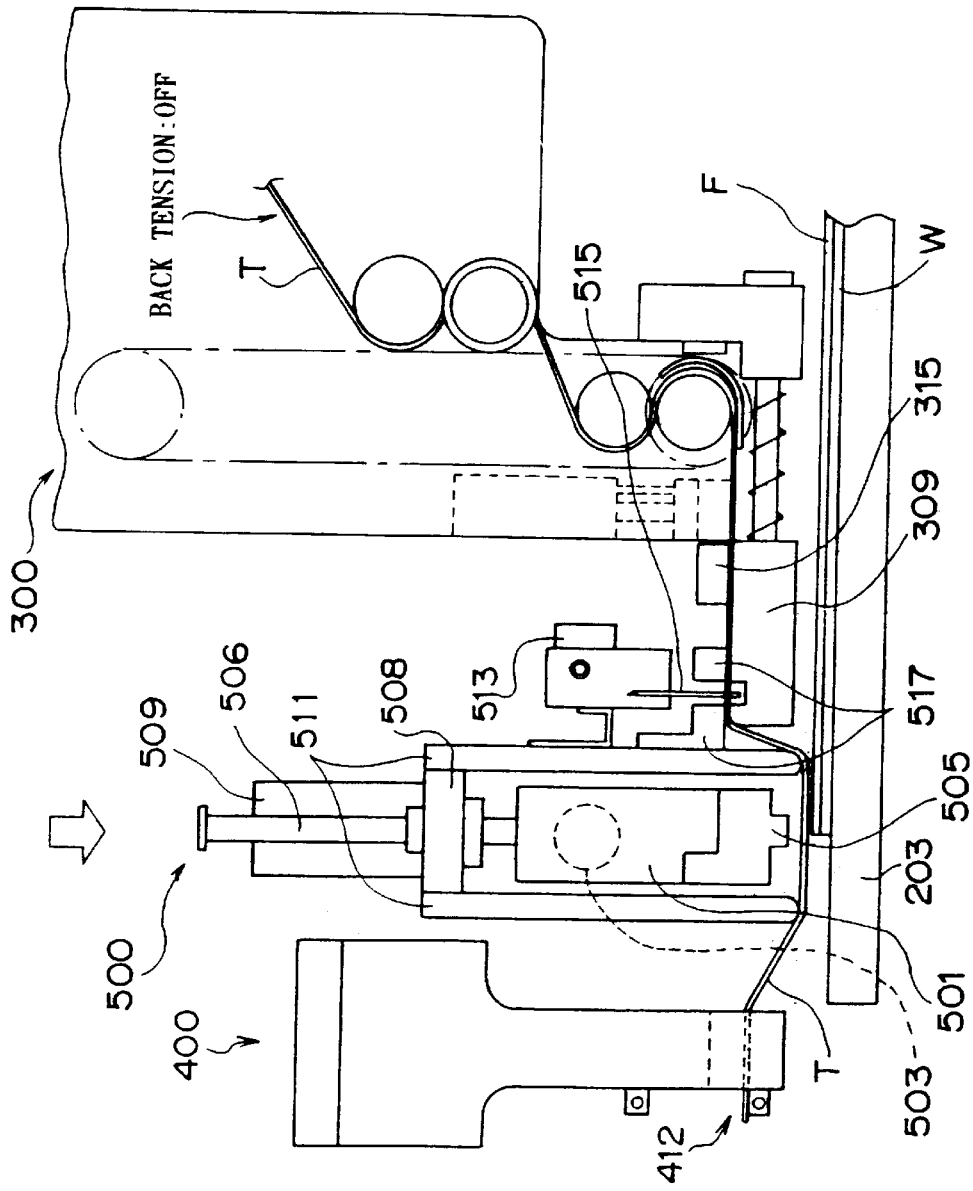

Next, a description of the heating/cutting portion 500 will be given. In this connection, FIG. 9A is an enlarged plan view of the heating/cutting portion 500, and FIG. 9B is a side view thereof. Further, a front view of the heating/cutting portion 500 is illustrated in FIG. 13. As shown in these drawings, a rod shaped heater 503 is embedded in a heating block 501, and a heat tool 505 is fixed to the lower end of the heating block 501 by means of a screw 507. The lower end of the heat tool 505 is formed to have an uneven shape like that shown in FIG. 9B to enable heat to be applied locally. Further, the heat tool 505 is replaceable to enable variously shaped tools to be used in accordance with size and curvature of the wafers. The heating block 501 is mounted on a frame 508 by means of two guide shafts 506 so as to be freely movable in the vertical direction (the Z-axis direction shown in the drawings), and is raised and lowered by a cylinder 509 fixed to the frame 508.

The heating block 501 is sandwiched in front and back (in the X-axis direction) between two plate-shaped tape pressing guides 511 mounted to the frame 508. The tape pressing guides 511 are heat-resistant members made, for example, from a material such as polyimide resin or polyether ether ketone resin. The upper ends of the tape pressing guides 511 are fixed to the frame 508 and the lower ends are rounded so as to be freely capable of pressing the adhesive tape T. Further, a cutter moving cylinder 513 is mounted on the side of one of the tape pressing guides 511 (FIG. 9A), and mounted to a piston tip portion of the cylinder 513 is a cutting blade 515 which is reciprocally moved in the Y-axis direction by the movement of the cylinder 513. Arranged below the cylinder 513 is a plate-shaped tape press 517, and a slit 517a is formed in the tape press 517 to enable the passage of the cutting blade 515.

The heating/cutting portion 500 is movable in the vertical direction (the Z-axis direction in the drawings). Namely, the heating/cutting portion 500 is moved in the Z-axis direction by a cylinder 519 (FIG. 8) which is fixed to the base plate 101.

Next, the operation of the sheet removing portion 950 will be described in the following Steps 1~8.

(Step 1: Setting the Wafer in place)

A wafer W is set in place on the table 203 by the movable arm 701. After the wafer W is aligned with the suction groove 219 in the table 203 which corresponds to the size of the wafer W, a vacuum device (not shown in the drawings) is operated to hold the wafer W by suction, and then the table 203 is moved directly below the tape supplying portion 300 (FIG. 10).

At the tape supplying portion 300, the adhesive tape T is suspended in advance through the guide roller 307, the pinch roller 303 and the tension roller 305 in that respective order, and the adhesive tape T is held near the tip portion thereof by the tape press 315 and the tape receiving plate 309. Further, the tension roller 305 is driven to apply an appropriate back tension to the adhesive tape T.

At this time, the tape chuck 412 of the peeling head portion 400 is open. Then, the peeling head portion 400 is moved in the X-axis direction toward the tape feeding portion 300. Further, this movement of the peeling head portion 400 may be carried out simultaneously with the movement of the table 203.

(Step 2: Gripping the Tip of the Adhesive Tape T)

Figure 11:
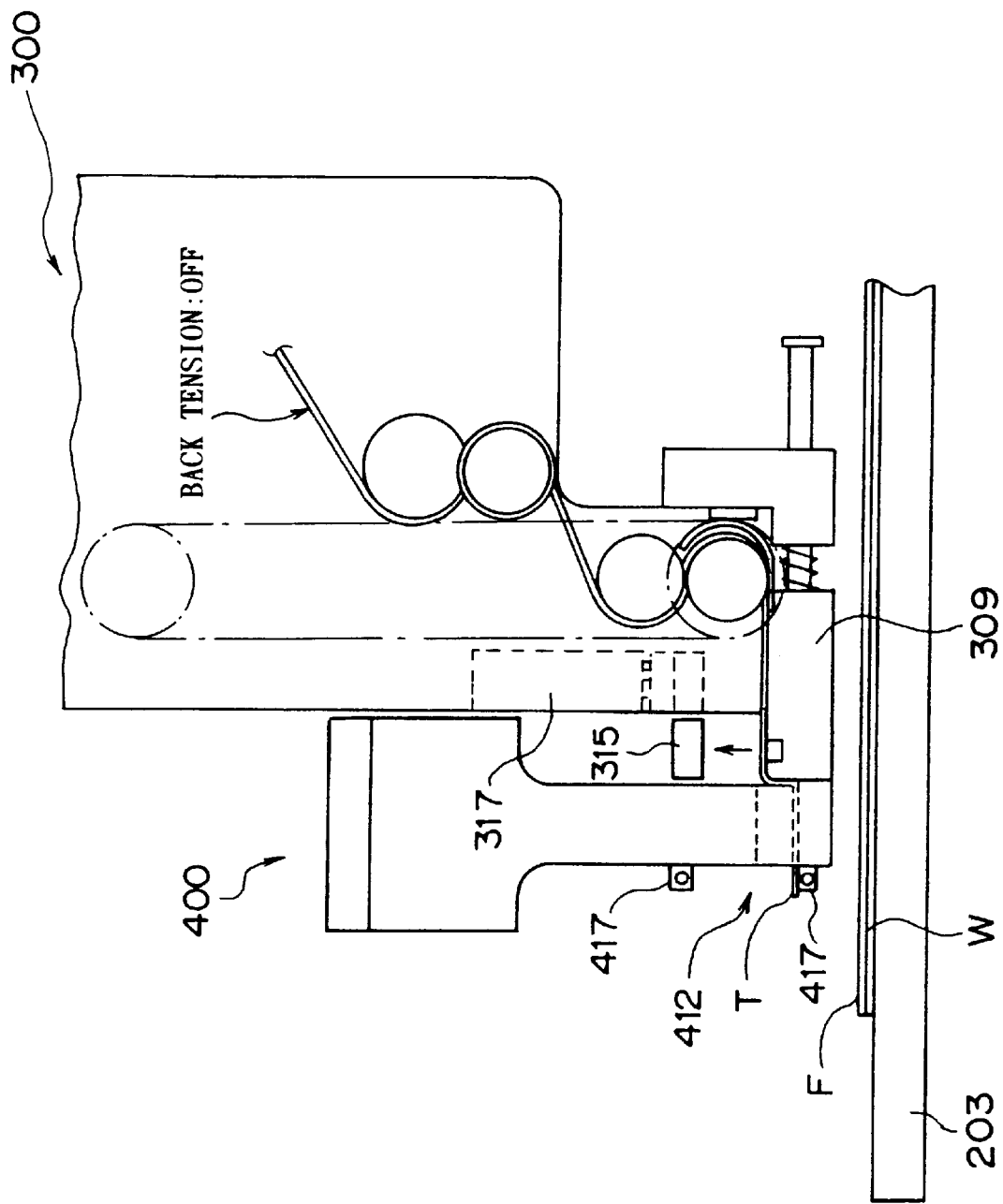

As shown in FIG. 11, the peeling head portion 400 pushes the tape receiving plate 309 backwards, and this backward movement of the receiving plate 309 forces the tip of the adhesive tape T into the entrance portion of the tape chuck 412. At this time, because the adhesive tape T is held between the tension roller 305 and the pinch roller 303, and the adhesive tape T is pushed from the rear by the tape pushing guide 306, only the tape receiving plate 309 moves backwards without causing the adhesive tape T which is suspended over the tape receiving plate 309 from moving backward, and in this way the tip of the adhesive tape T is reliably inserted in the entrance portion of the tape chuck 412. When the tip of the adhesive tape T is detected by the sensor 417, the tape chuck 412 is closed to grasp the tip of the adhesive tape T. Next, the back tension created by the tension roller 305 is released and the tape pressing plate 315 is raised and separated from the adhesive tape T.

(Step 3: Pulling Out the Adhesive Tape T)

Figure 12:
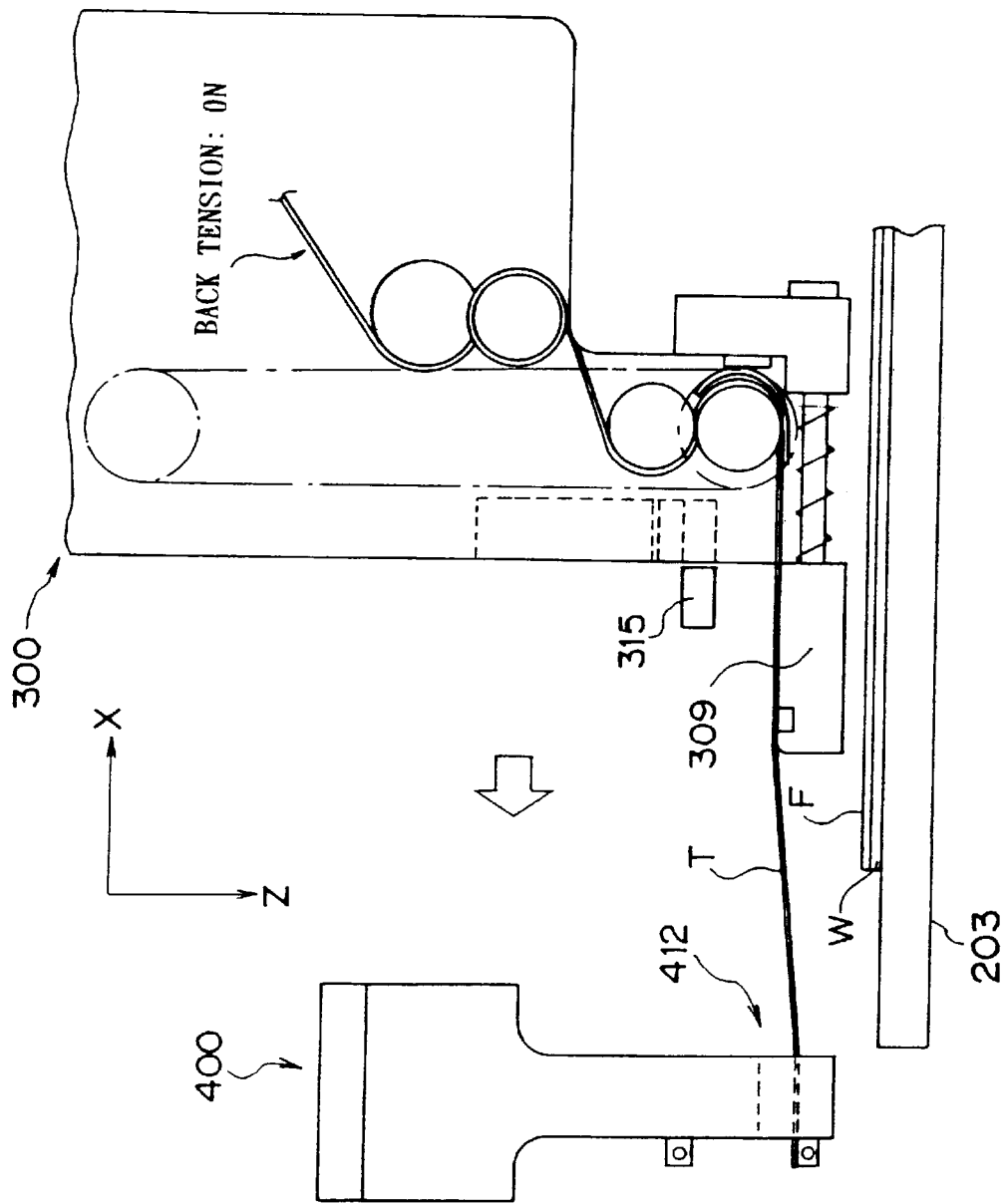

As shown in FIG. 12, the peeling head portion 400 is moved in the X-axis direction away from the tape feeding portion 300, and this causes the adhesive tape T to be pulled out. At this time, the tension roller 305 is operated to apply back tension.

(Step 4: Thermocompressive Bonding and Cutting of the Tape T)

As shown in FIG. 13, the heating/cutting portion 500 is lowered, and the tape pressing guides 511 push the adhesive tape T downward to the vicinity of the wafer W. The adhesive tape T is pressed on the tape receiving plate 309 by the tape pressing plate 517, 315. After that, the heater raising/lowering cylinder 509 is driven to press the heat tool 505 against the protecting sheet F of the tip portion of the wafer W for several seconds, and in this way the adhesive tape T is thermocompressively bonded to the protecting sheet F. At this time, the position of the table 203 is adjusted in accordance with the size of the wafer W. In this connection, the table 203 may be moved to a position directly below the heating/cutting portion 500 by the time the adhesive tape T undergoes thermocompressive bonding. Then, the cutting blade 515 is moved in the Y-axis direction to cut the adhesive tape T to a prescribed length.

(Step 5: Raising the Tape Supplying Portion and the Heating/Cutting Portion)

Figure 14:
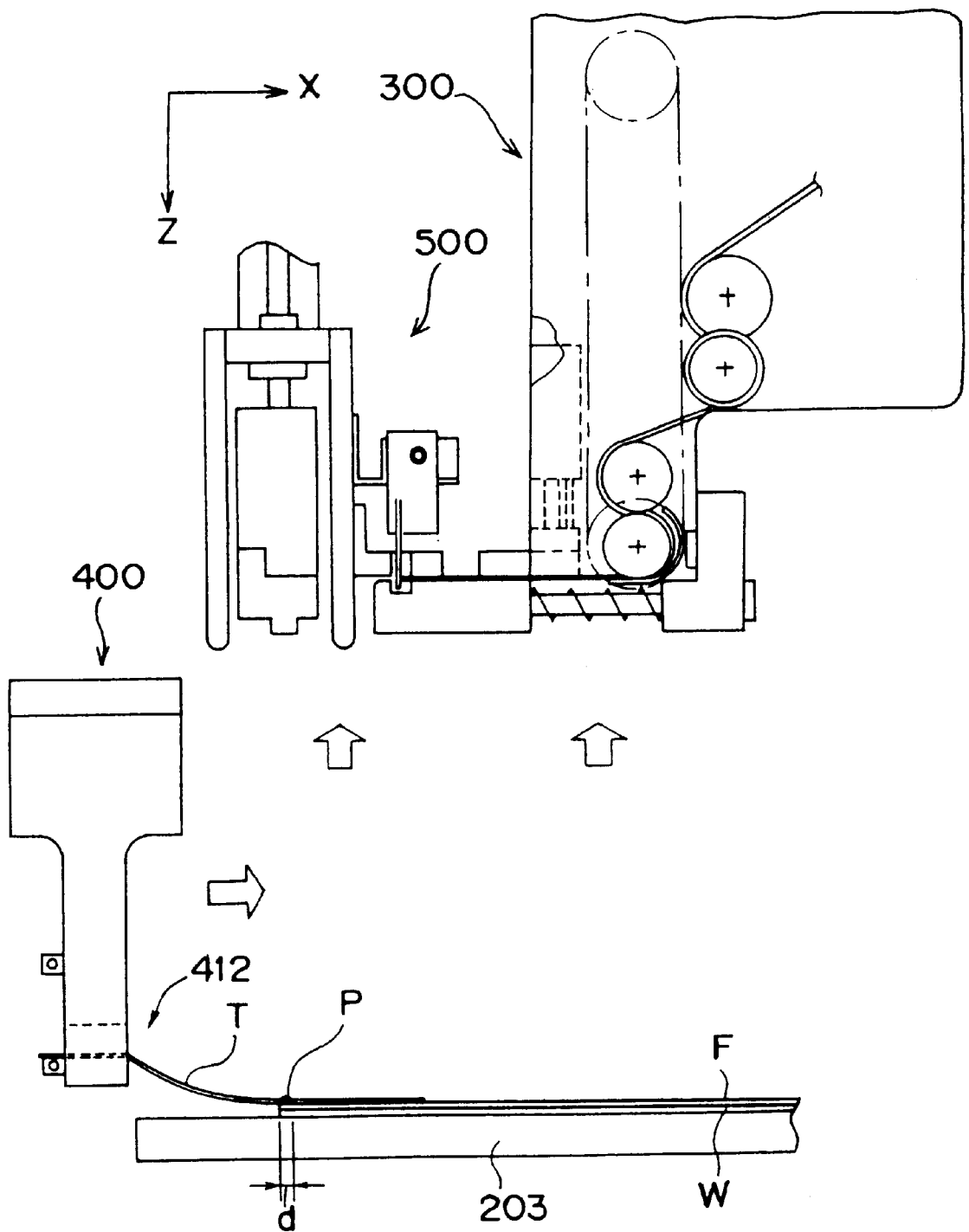

As shown in FIG. 14, the tape supplying portion 300 and the heating/cutting portion 500 are raised. As shown in this drawing, the bonding point P of the adhesive tape T and the protecting sheet F is near the edge of the wafer W. For example, a distance d from the edge of the wafer W to the bonding point P is within 3 mm. Since the prescribed length and width of tape T are less than the diameter of sheet F, bonding point P covers a small surface area.

(Step 6: Removing the Protecting Sheet)

Figure 15:
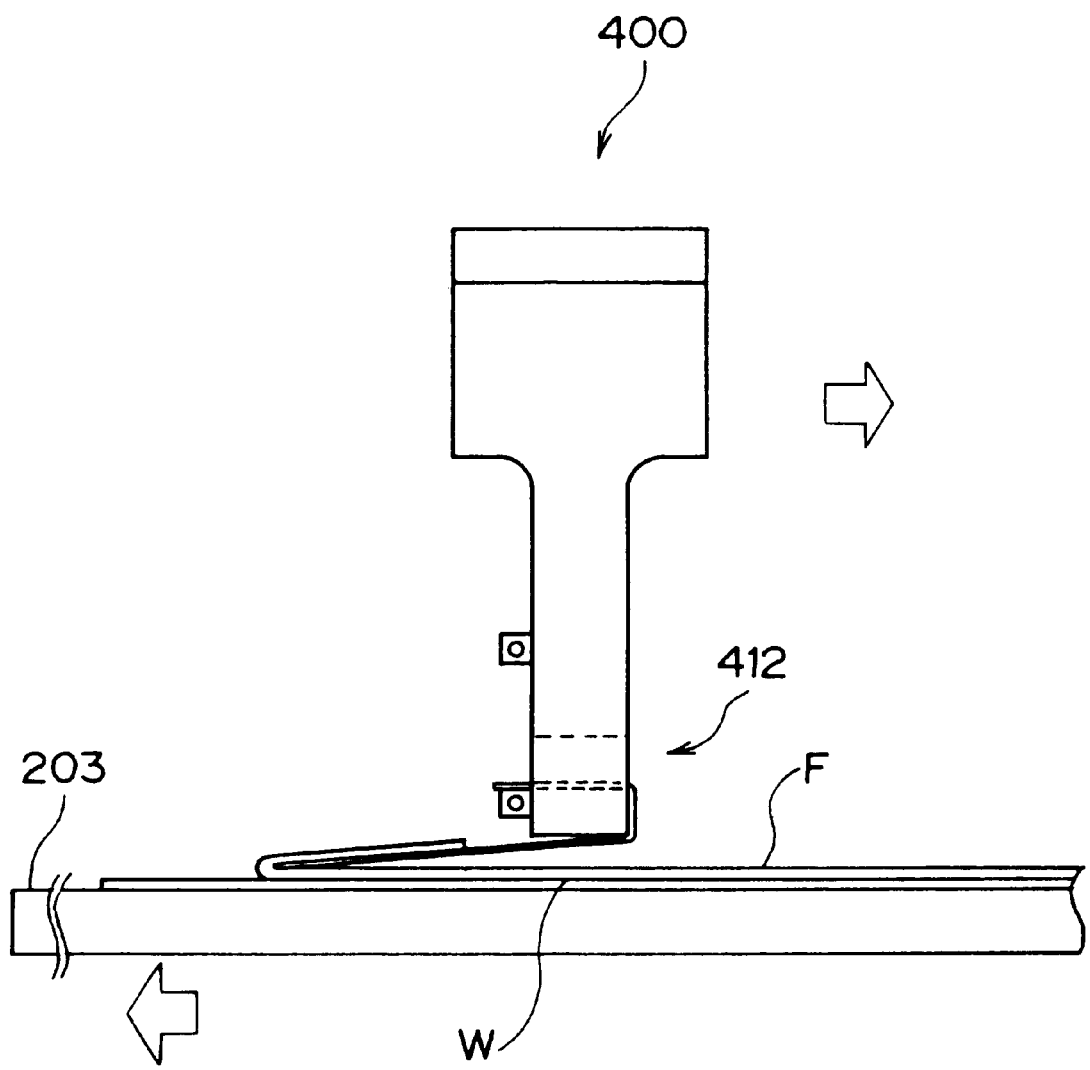

As shown in FIG. 15, the peeling head portion 400 is moved to the right in the drawing by the motor 407, and the table 203 is moved to the left in the drawing by the motor 211, whereby the protecting sheet F is held and peeled off the wafer W by the peeling head portion 400. At this time, the peeling head portion 400 holds the adhesive tape T preferably at the position as close as possible to the protecting sheet F so that the protecting sheet F will be pulled in the horizontal direction. In this way, it is possible to minimize the stress on the wafer W, while at the same time making it difficult for the wafer W, which is held by suction to the table 203, from slipping out of place on the table 203. Further, because the table 203 is simultaneously moved in a direction opposite the direction of movement of the peeling head portion 400, the peeling operation can be completed in a relatively short period time.

(Step 7: Disposing of the Protecting Sheet)

Figure 16:
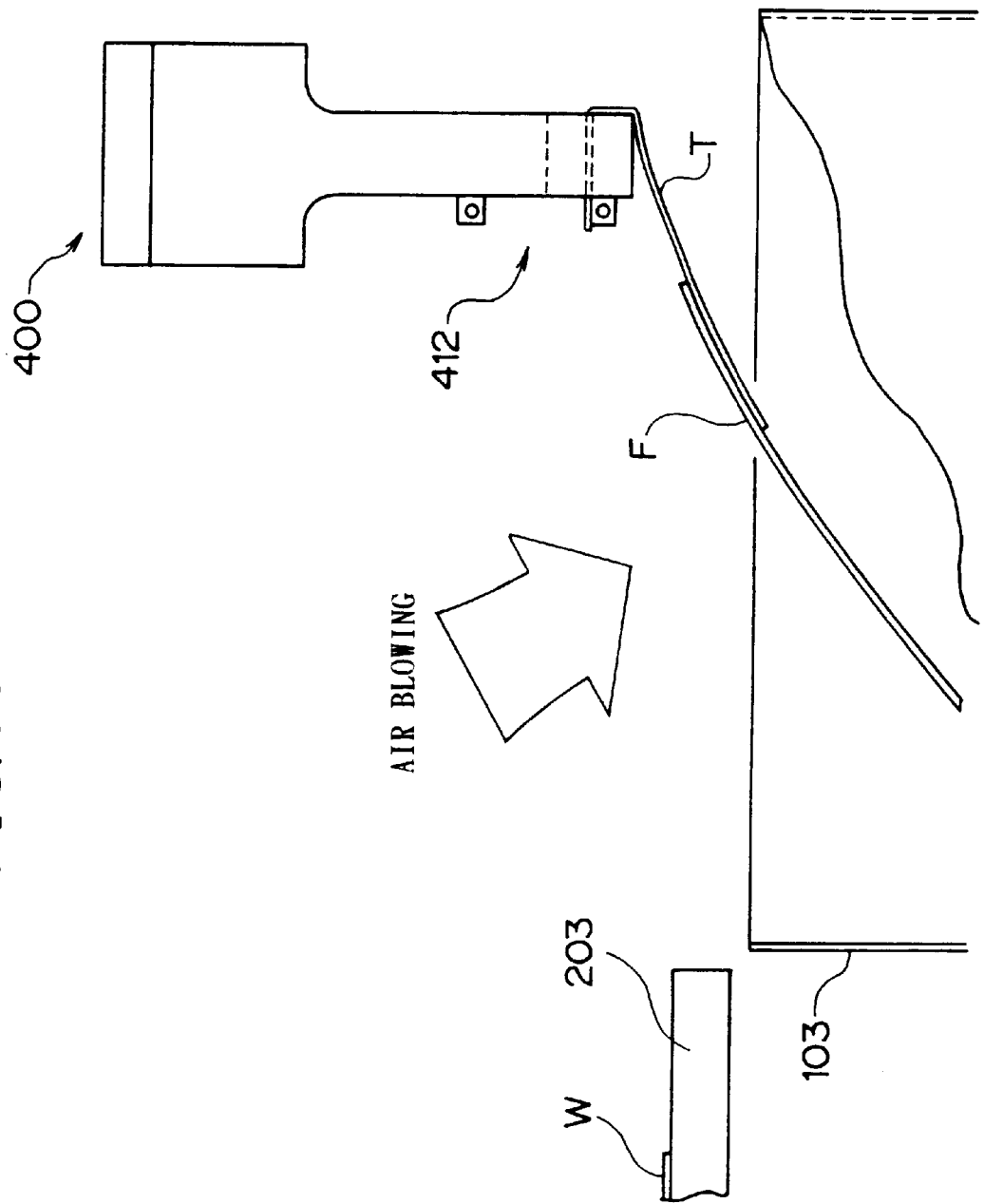

As shown in FIG. 16, when the peeling head portion 400 has been moved to a prescribed position, the tape chuck 412 is opened to drop the adhesive tape T and the protecting sheet F into a disposal box 103 housed inside the platform 100. At this time, disposal may be facilitated by blowing in high pressure air from above.

(Step 8: Retrieving the Wafer)

When the table 203 is returned to its original position, the ascension/descension table 217 is raised, and then the wafer W is retrieved. Such retrieval may be carried out by the movable arm 701.

As described above, because the adhesive tape T is bonded to an edge portion of the protecting sheet, it is possible to prevent the kind of wafer damage caused in the prior art method in which the wafer is pressed by a press roller, and this makes the present invention suitable for removing protecting sheets from wafers of increased diameter and thinness. As for the adhesive tape, the use of a heat-sensitive adhesive tape like that described above for bonding with a wafer edge portion is preferred, but it is also possible to use other types of adhesive tapes capable of forming a strong bond with an edge portion, i.e., capable of forming a strong bond over a small surface area.

Furthermore, when a heat-sensitive adhesive tape is used for the adhesive tape T, because the adhesive tape T is thermocompressively bonded to a portion of the protecting sheet F, it is possible to prevent the wafer damage caused in the prior art by pressing the wafer with a press roller. Further, in the case of a pressure-sensitive adhesive tape like that used in the prior art, if grinding waste, cutting waste or water adheres to the surface of the protecting sheet, the bond between the adhesive tape and the protecting sheet will be weak, and this will lead to either incomplete peeling on the first try or will require the protecting sheet of the wafer to be cleaned prior to bonding the adhesive tape thereto. However, by using a heat-sensitive adhesive tape as described in the embodiment above, reliable bonding can be carried out even if the surface of the protecting tape has dirt or water adhered thereto. Moreover, because such heat-sensitive adhesive tape has no adhesive property at room temperature, there is no need to carry out a surface treatment on the conveyor roller and there is no need for a release liner sheet, and as a result it becomes easy to handle the adhesive tape. Furthermore, because it is possible to use relatively low-priced heat sealing materials which are capable of forming strong adhesive bonds, the present invention makes it possible to economize resources and lower costs.

Moreover, when using a heat-sensitive adhesive tape in the above-described apparatus for bonding with an edge portion of the protecting sheet, because the edge portion of the wafer is at a step portion which is not formed with an electrical circuit, the wafer is not harmed even when thermocompression is carried out. Thus, a heat-sensitive adhesive tape has the added advantage of being easy to use.

Furthermore, even though the embodiment described above was provided with a cutting means comprised of a cutting blade for cutting the adhesive tape to a prescribed length, the present invention is not limited to such structure, and instead it is possible to use various other cutting means. Moreover, it is possible to omit the cutting means from the embodiment described above. For example, it is possible to eliminate the cutting step by starting with adhesive tape which has been pre-cut to appropriate length strips, and then using such a prescribed-length adhesive tape strip to bond to an edge portion of the protecting sheet F and then pulling such adhesive tape strip to peel away the protecting sheet F.

As described above, the present invention makes it possible to remove a sheet from a plate-shaped member such as a wafer or the like without damaging the plate-shaped member.

What is claimed is:

1. A sheet removing apparatus to remove a sheet applied to a plate-shaped member, comprising:

an adhesive tape with a prescribed length and width each less than a diameter of the sheet;

bonding means for bonding the adhesive tape to a front surface of the sheet; and sheet removing means for pulling the adhesive tape to remove the sheet from the plate-shaped member.

2. The sheet removing apparatus of claim 1, wherein the adhesive tape is a heat-sensitive adhesive tape.

3. A sheet removing apparatus which uses an adhesive tape to remove a sheet applied to a plate-shaped member, comprising:

a table for supporting the plate-shaped member;

an adhesive tape having a prescribed length and width, each less than a diameter of the sheet;

a tape supplying means for supplying the adhesive tape;

bonding means for bonding the adhesive tape supplied by the tape supplying means to a front surface of the sheet; and movement means for holding and moving the adhesive tape relative to the plate-shaped member.

4. The sheet removing apparatus of claim 3, wherein the adhesive tape is a heat-sensitive adhesive tape.

5. A sheet removing apparatus which uses an adhesive tape to remove a sheet applied to a plate-shaped member, comprising:

a table for supporting the plate-shaped member;

a tape supplying means for supplying the adhesive tape;

bonding means for bonding the adhesive tape supplied by the tape supplying means to an edge portion of the sheet;

movement means for holding and moving the adhesive tape relative to the plate-shaped member; and a cutting means for cutting the adhesive tape supplied from the tape supplying means to a prescribed length.

6. A method of removing a sheet applied to a plate-shaped member by using an adhesive tape with a prescribed length and width each less than a diameter of the sheet, comprising the steps of:

bonding the adhesive tape to a front surface of the sheet; and pulling the adhesive tape to remove the sheet from the plate-shaped member.

7. The sheet removing method of claim 6, wherein the adhesive tape is a heat-sensitive adhesive tape.

8. A sheet removing apparatus to remove a sheet applied to a plate-shaped member formed with a reference portion, comprising:

a detection means for detecting the position of the reference portion of the plate-shaped member;

an adhesive tape having a prescribed length and width each less than a diameter of the sheet;

positioning means for positioning the reference portion of the plate-shaped member away from a bonding portion of the adhesive tape;

bonding means for bonding the adhesive tape to a front surface of the sheet; and sheet removing means for pulling the adhesive tape to remove the sheet from the plate-shaped member.

9. The sheet removing apparatus of claim 8, wherein the sheet is an ultraviolet hardening type adhesive sheet and the sheet removing apparatus further comprises an ultraviolet irradiation means for irradiating the sheet with ultraviolet light.

10. A method of removing a sheet applied to a plate-shaped member formed with a reference portion by using an adhesive tape with a prescribed length and width each less than a diameter of the sheet, the method comprising:

detecting the position of the reference portion of the plate-shaped member;

bonding the adhesive tape to a front surface of the sheet at a position away from the reference portion; and pulling the adhesive tape to remove the sheet from the plate-shaped member.

11. The sheet removing method of claim 10, wherein the sheet is an ultraviolet hardening type adhesive sheet, further comprising the step of:

irradiating the sheet with ultraviolet light before carrying out the sheet removing step.

12. A sheet removing apparatus which uses an adhesive tape to remove a sheet applied to a plate-shaped member, comprising:

an adhesive tape having a prescribed length and width each less than the entire length of the sheet;

bonding means for bonding the adhesive tape to a front surface of the sheet; and sheet removing means for pulling the adhesive tape to remove the sheet from the plate-shaped member.

13. A method of removing a sheet applied to a plate-shaped member by using an adhesive tape, comprising the steps of:

bonding the adhesive tape to a front surface of the sheet;

said adhesive tape having a length and width each less than the entire length of the sheet; and pulling the adhesive tape to remove the sheet from the plate-shaped member.

14. A sheet removing apparatus to remove a sheet applied to a plate-shaped member, comprising:

an adhesive tape with a prescribed length and width each less than a diameter of the sheet;

bonding means for bonding a part of the adhesive tape to an edge portion of the sheet; and sheet removing means for pulling an end of the adhesive tape to remove the sheet from the plate-shaped member.

* * * * *